United States Patent
Min (10) Patent No.: US 7,679,453 B2
(45) Date of Patent: Mar. 16, 2010

(54) PHASE-LOCKED LOOP CAPABLE OF DYNAMICALLY ADJUSTING PHASE OF OUTPUT SIGNAL ACCORDING TO DETECTION RESULT OF PHASE/FREQUENCY DETECTOR, AND METHOD THEREOF

(75) Inventor: Shaw-N Min, Tainan Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 75 days.

(21) Appl. No.: 11/940,301

(22) Filed: Nov. 14, 2007

(65) Prior Publication Data

US 2008/0111634 A1 May 15, 2008

(30) Foreign Application Priority Data

Nov. 15, 2006 (TW) ............... 95142269 A (51) Int. Cl.
H03L 7/085 (2006.01)

(52) U.S. Cl. .............. 331/1 A; 331/10; 331/44; 331/45

(58) Field of Classification Search .............. 331/1 A, 331/16, 44, 45, 10
See application file for complete search history.

(56) References Cited

U.S. PATENT DOCUMENTS 6,711,227 B1 * 3/2004 Kaylani et al. .............. 375/372
7,173,462 B1 * 2/2007 Wang .......................... 327/158
2003/0210758 A1 * 11/2003 Lee et al. ..................... 375/371
2005/0206417 A1 * 9/2005 Morche ....................... 327/158
2006/0171495 A1 * 8/2006 Youssouflan ................ 375/376
2006/0250170 A1 * 11/2006 Wang .......................... 327/156

OTHER PUBLICATIONS

Chinese language office action (mailed Nov. 4, 2009).
English language translation of abstract of TW 527779 (published Apr. 11, 2003).
English language translation of abstract of TW 407401 (published Oct. 1, 2000).
English language translation of abstract TW 595105 (published Jun. 21, 2004).

* cited by examiner

Primary Examiner—Joseph Chang
Assistant Examiner—Jeffrey Shin
(74) Attorney, Agent, or Firm—Thomas, Kayden, Horstemeyer & Risley (57) ABSTRACT

A phase-locked method includes: generating a selection signal according to a detection result of a phase/frequency detector (PFD) of a phase-locked loop (PLL); generating a plurality of oscillation signals according to at least a first oscillation signal generated by the PLL, wherein the plurality of oscillation signals respectively correspond to a plurality of phases; and from the plurality of oscillation signals, selecting an oscillation signal as an output signal of the PLL according to the selection signal.

14 Claims, 6 Drawing Sheets

PHASE-LOCKED LOOP CAPABLE OF DYNAMICALLY ADJUSTING PHASE OF OUTPUT SIGNAL ACCORDING TO DETECTION RESULT OF PHASE/FREQUENCY DETECTOR, AND METHOD THEREOF

BACKGROUND OF THE INVENTION

1. Field of the Invention

The present invention relates to a phase-locked loop of a video display device, and more particularly, to a phase-locked loop capable of dynamically adjusting a phase of an output signal according to a detection result of a phase/frequency detector, and a method thereof.

2. Description of the Prior Art

Figure 1:
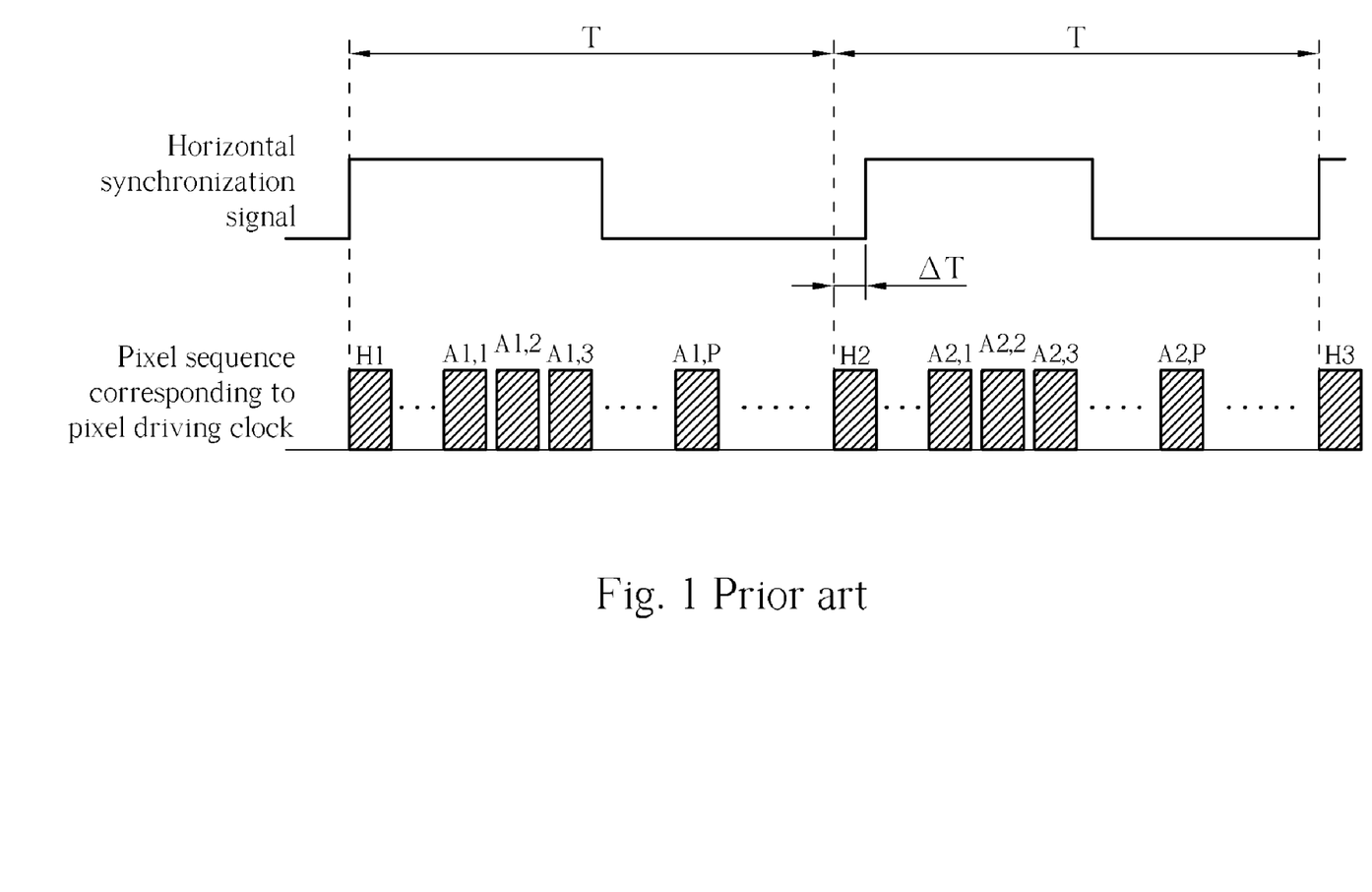
FIG. 1 is a diagram illustrating a pixel sequence corresponding to a pixel driving clock while a horizontal synchronization signal in a prior art display device has phase shift.

Please refer to FIG. 1. FIG. 1 is a diagram illustrating a pixel sequence corresponding to a pixel driving clock CLK0 while a horizontal synchronization signal HS0 in a prior art video display device (not shown) has a phase shift. A phase-locked loop of the video display device generates the pixel driving clock CLK0 according to the horizontal synchronization signal HS0. H1, H2, H3, etc, which are shown in FIG. 1, respectively represent initial periods corresponding to a first row of pixels, a second row of pixels, a third row of pixels, etc. in the pixel driving clock CLK0, and timing of the driving periods (A2,1), (A2,2), (A2,3), etc. relative to the initial period H2 in the second row of pixels equals timing of the driving periods (A1,1), (A1,2), (A1,3), etc. relative to the initial period H1 in the first row of pixels. If an average period of the horizontal synchronization signal HS0 is T, and the phase-locked loop locks a frequency corresponding to the average period T, the above-mentioned initial periods H1, H2, H3, etc. align initial positions of the driving periods of respective rows of pixels, as shown in FIG. 1. When the horizontal synchronization signal HS0 in the initial position of the driving periods of the second row of pixels has a phase shift corresponding to time difference ΔT, the second row of pixels shown by the video display device may have errors.

For example, if frequency of the horizontal synchronization signal HS0 is 60 kHz and frequency of the pixel driving clock CLK0 is 80 MHz, a period T of the horizontal synchronization signal HS0 may be ten or more microseconds, a horizontal scanning period corresponding to a pixel may be ten or more nanoseconds, and the above-mentioned time difference ΔT may be several nanoseconds. Because response time of the phase-locked loop is usually greater than the time difference ΔT, the phase-locked loop is unable to adjust the pixel driving clock instantaneously, merely letting the above-mentioned phase shift occur repeatedly. As a result, other rows of pixels displayed by the video display device may have errors due to phase shifts.

SUMMARY OF THE INVENTION

It is therefore an objective of the claimed invention to provide a phase-locked loop capable of dynamically adjusting a phase of an output signal according to a detection result of a phase/frequency detector, and a method thereof, to solve the above-mentioned problem.

It is another objective of the claimed invention to provide a phase-locked loop capable of dynamically adjusting the phase of an output signal according to a detection result of a phase/frequency detector, and a method thereof, wherein the phase of the output signal corresponds to the phase of an input signal of the phase-locked loop.

In an embodiment of the claimed invention, a phase-locking method is provided. The phase-locking method comprises: generating a selection signal according to a detection result of a phase/frequency detector of a phase-locked loop; generating a plurality of oscillation signals according to at least a first oscillation signal generated by the phase-locked loop, wherein the plurality of oscillation signals respectively correspond to a plurality of phases; and from the plurality of oscillation signals, selecting an oscillation signal as an output signal of the phase-locked loop according to the selection signal.

In addition to providing the phase-locking method mentioned above, the present invention correspondingly provides a phase-locked loop. The phase-locked loop comprises: a phase/frequency detector, for generating a detection result according to an output signal; an oscillator, coupled to the phase/frequency detector, for generating at least a first oscillation signal according to the detection result; an oscillation signal generator, coupled to the oscillator, for generating a plurality of oscillation signals according to the first oscillation signal, wherein the plurality of oscillation signals respectively correspond to a plurality of phases; and a selection signal generator, coupled to the phase/frequency detector and the oscillation signal generator, for generating a selection signal according to the detection result. The oscillation signal generator selects an oscillation signal from the plurality of oscillation signals as an output signal of the phase-locked loop according to the selection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
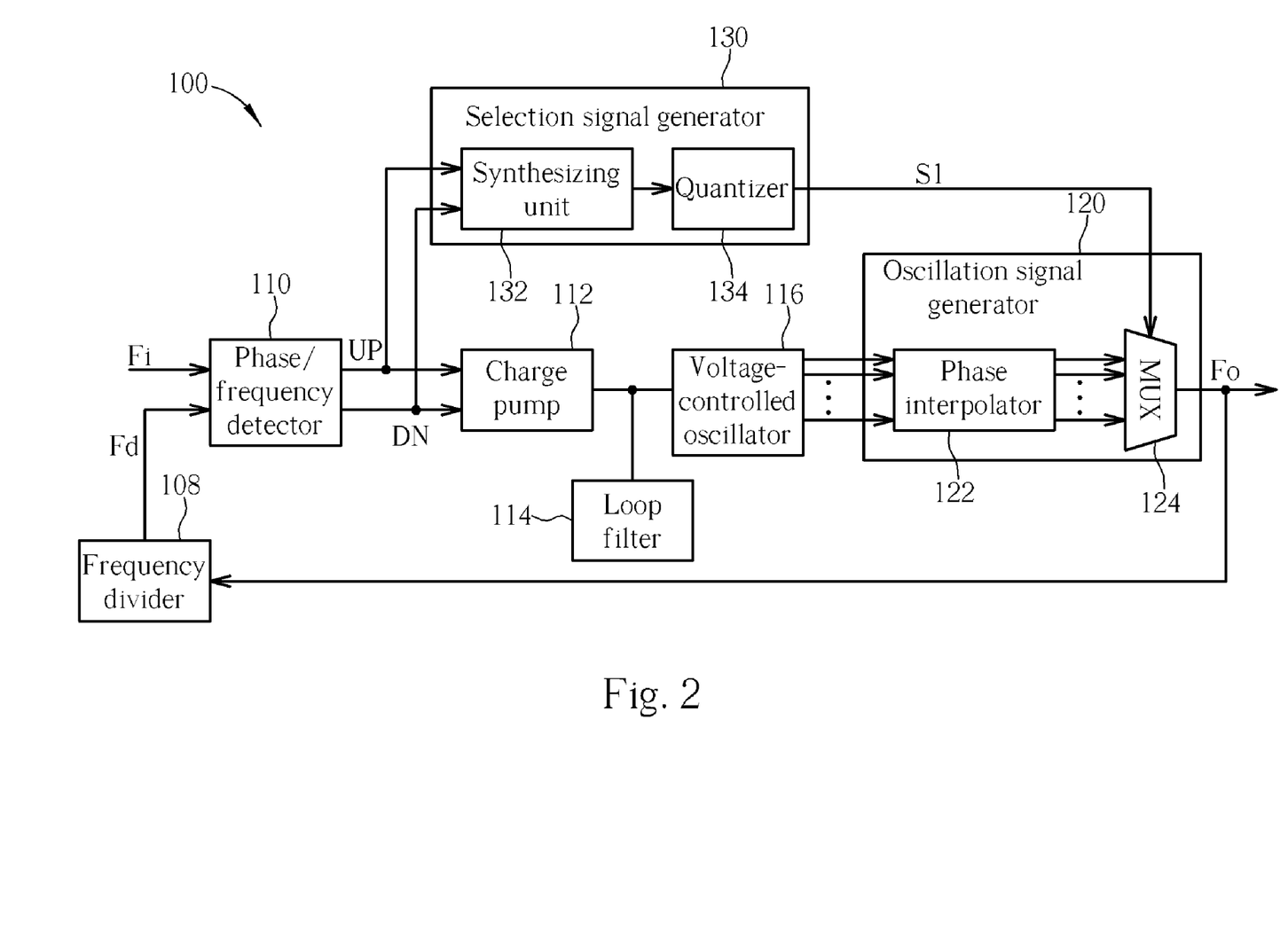
FIG. 2 is a diagram of a phase-locked loop according to a first embodiment of the present invention.

Please refer to FIG. 2. FIG. 2 is a diagram of a phase-locked loop 100 according to a first embodiment of the present invention. The phase-locked loop 100 comprises a phase/frequency detector 110, a charge pump 112, a loop filter (LF) 114, a voltage-controlled oscillator (VCO) 116, an oscillation signal generator 120, a selection signal generator 130, and a frequency divider 108, wherein the oscillation signal generator 120 comprises a phase interpolator (PI) 122 and a multiplexer 124, and the selection signal generator 130 comprises a synthesizing unit 132 and a quantizer 134.

The phase/frequency detector 110 generates a detection result according to an input signal Fi and a feedback signal of the phase-locked loop (for example, an output signal Fo or a frequency-divided signal Fd corresponding to the output signal Fo). As shown in FIG. 2, the phase-locked loop 100 of this embodiment utilizes the output signal Fo as the feedback signal, and the phase/frequency detector 110 performs operations according to the frequency-divided signal generated by the output signal Fo divided utilizing the frequency divider 108. According to this embodiment, the above-mentioned detection result comprises two detection signals UP and DN, wherein the detection signal UP controls the charge pump 112 to increase a control voltage of a node between the charge pump 112 and the voltage-controlled oscillator 116, and the detection signal DN controls the charge pump 112 to decrease the control voltage, so the control voltage corresponds to the detection result. In addition, the loop filter 114 usually comprises a resistor-capacitor (R-C) circuit. The architectures and theorems of the above-mentioned elements 108, 110, 112, 114, and 116 are well known to those skilled in the pertinent art, and therefore not explained in detail here.

In this embodiment, the voltage-controlled oscillator 116 generates J first oscillation signals with the same frequency according to the detection signal, and respectively outputs J first oscillation signals to the oscillation signal generator 120 by J output terminals, wherein the J first oscillation signals respectively correspond to J different phases. The phase interpolator 122 of the oscillation signal generator 120 performs a phase interpolation upon the J first oscillation signals to generate K oscillation signals, and respectively outputs the K oscillation signals to the multiplexer 124 by K output terminals, wherein the K oscillation signals respectively correspond to K different phases, and K is greater than J. The frequency of each of the K oscillation signals is equal to the common frequency of the J first oscillation signals.

According to the present invention, the selection signal generator 130 generates a selection signal S1 according to the detection result. In this embodiment, the synthesizing unit 132 synthesizes the detection signals UP and DN to generate a synthesized signal at its output terminal, and the quantizer 134 then quantizes the synthesized signal to generate the selection signal S1. According to different implementations, signal formats of the detection signals UP and DN are adjustable. In addition, the synthesizing unit 132 is capable of being implemented by an adder or a subtracter to detect the phase shift of the input signal Fi, where the synthesized signal represents an operational result of a corresponding element (for example, the adder or the subtracter). In this embodiment, the K input terminals of the multiplexer 124 are coupled to the phase interpolator 122 according to a predetermined order decided by a theoretical computation or a trial-and-error experiment performed in advance for receiving the K oscillation signals. Therefore, while the multiplexer 124 selects an oscillation signal from the K oscillation signals as the output signal Fo according to the selection signal S1, it is capable of correspondingly adjusting a phase of the output signal Fo to thereby solve the problem shown in FIG. 1.

Figure 3:
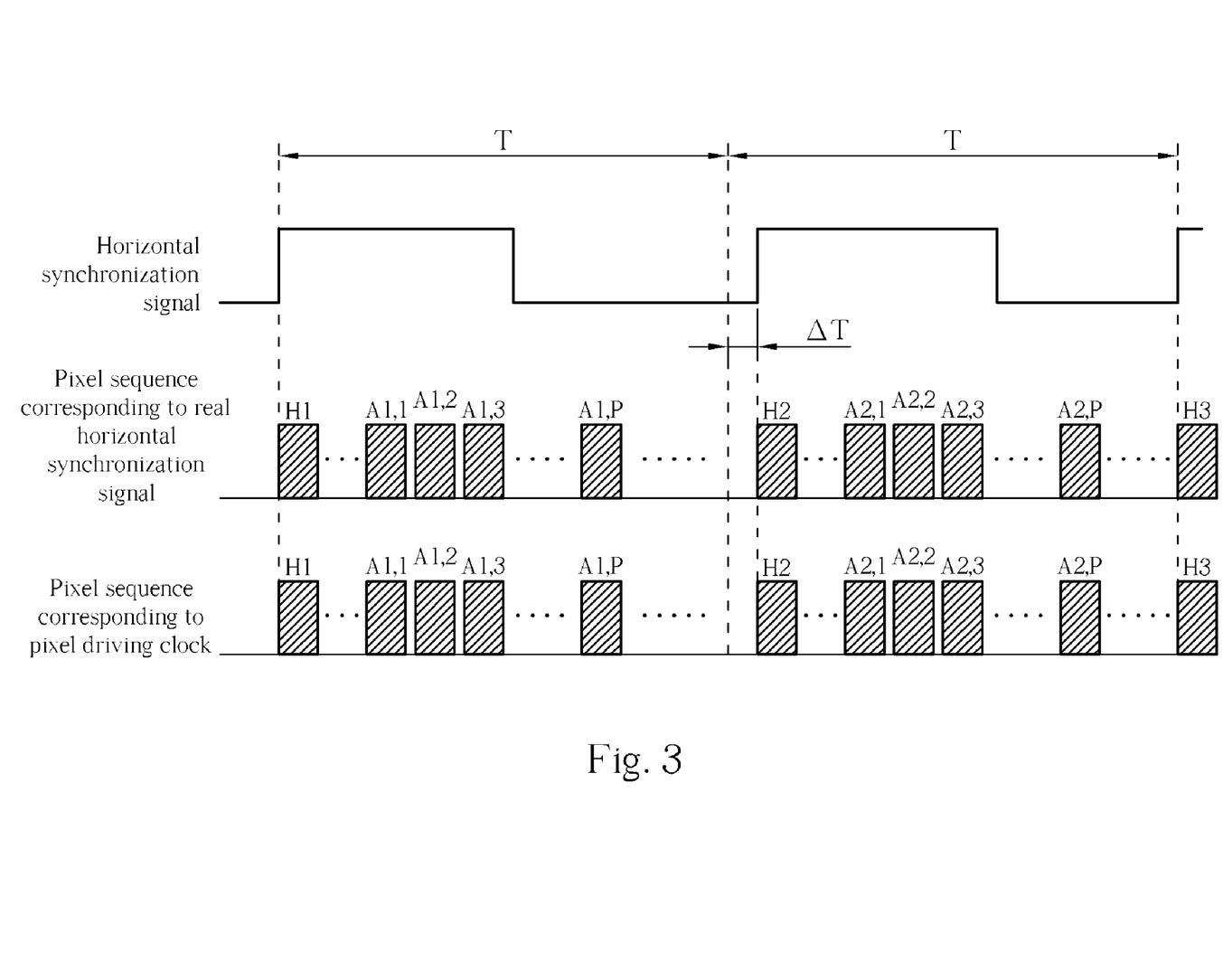
FIG. 3 is a diagram illustrating a pixel sequence corresponding to a pixel driving clock according to an embodiment of the present invention, wherein the pixel drive clock is generated by the phase-locked loop shown in FIG. 2.

FIG. 3 is a diagram illustrating a pixel sequence corresponding to a pixel driving clock CLK1 according to the embodiment shown in FIG. 2, wherein various reference symbols shown in FIG. 1 are used in FIG. 2 for clear illustration. In this embodiment, the phase-locked loop 100 is installed in a video display device, the input signal Fi is a horizontal synchronization signal HS1 of the video display device, and the output signal Fo is the pixel driving clock CLK1 mentioned above. While the multiplexer 124 selects an oscillation signal from the K oscillation signals as the output signal Fo according to the selection signal S1, it is capable of correspondingly adjusting a phase of the output signal Fo, i.e. adjusting a phase of the pixel driving clock CLK1. As a result, the phase-locked loop 100 compensates the initial period H2 for the phase shift corresponding to the time difference ΔT shown in FIG. 3. Here, the phase shift compensation method in this embodiment is to shift the driving period of each pixel at the second row by ΔT, i.e. a timing of the driving periods (A2,1), (A2,2), (A2,3), etc. relative to the initial period H2 in the second row of pixels is equal to timing of the driving periods (A1,1), (A1,2), (A1,3), etc. relative to the initial period H1 in the first row of pixels. Therefore, shifting the driving period of each pixel in the second row by ΔT means each pixel adapts to the phase shift occurring to this period of the horizontal synchronization signal HS1, thereby driving pixels at the second row correctly. Similarly, the driving periods of pixels in other rows are capable of being dynamically adjusted to adapt to the phase shift that occurs to a corresponding period of the horizontal synchronizing signal HS1.

Figure 4:
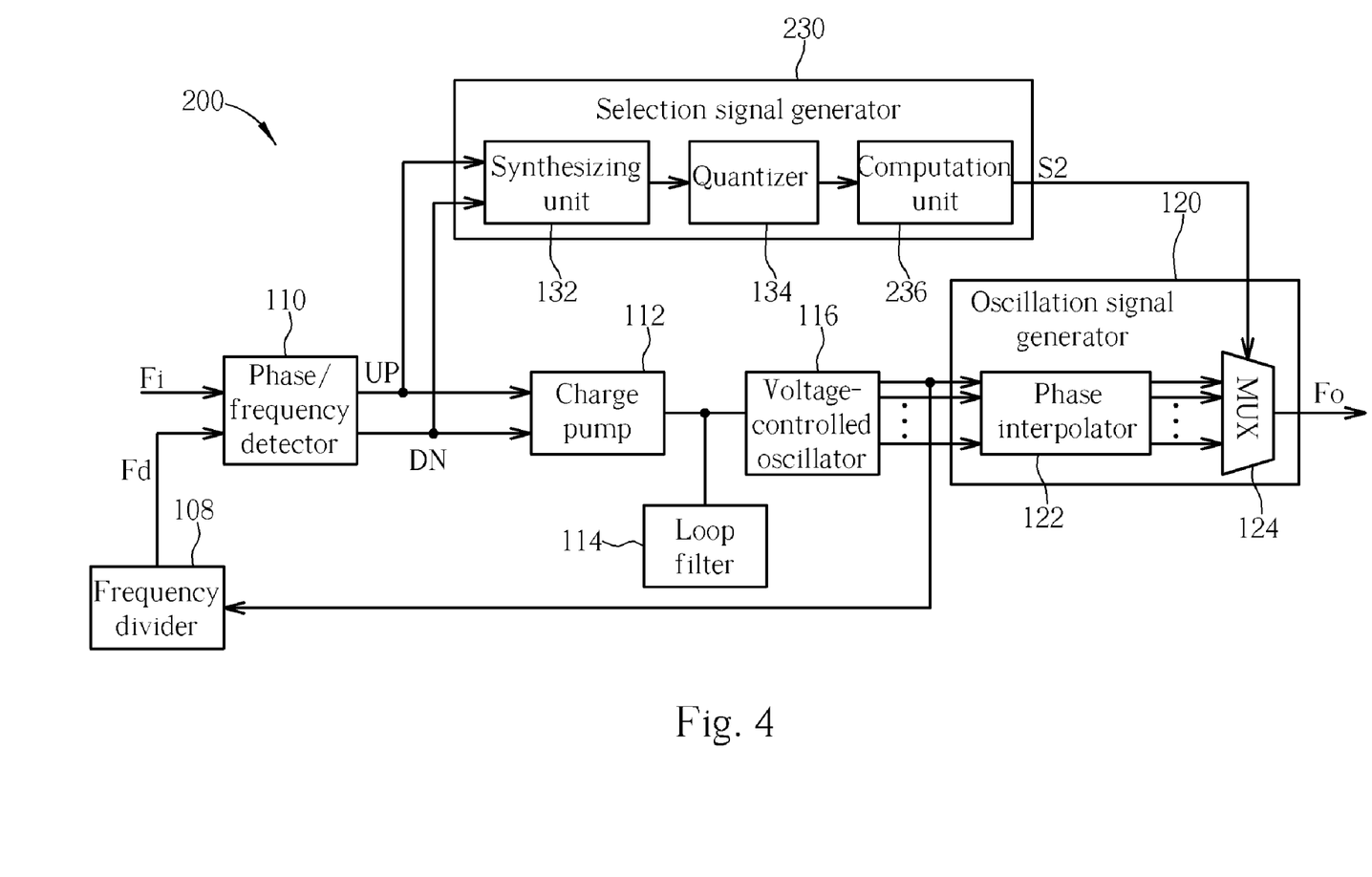
FIG. 4 is a diagram of a phase-locked loop according to a second embodiment of the present invention.

FIG. 4 is a diagram of a phase-locked loop 200 according to a second embodiment of the present invention. This embodiment is similar to the first embodiment, and the differences are described as follows. In this embodiment, the frequency divider 108 is coupled to a specific output terminal of the voltage-controlled oscillator 116 (for example, the top-most output terminal in the J output terminals of the voltage-controlled oscillator 116 shown in FIG. 4; however, this is only one embodiment, and is not meant to limit the scope of the present invention), so the phase-locked loop 200 utilizes a specific oscillation signal in the J first oscillation signals as the feedback signal instead of utilizing the output signal Fo as the feedback signal. In addition, in this embodiment the aforementioned selection signal generator 130 is replaced with a selection signal generator 230. In addition to the synthesizing unit 132 and the quantizer 134 mentioned above, the selection signal generator 230 further comprises a computation unit 236. According to this embodiment, the quantizer 134 quantizes the synthesized signal generated by the synthesizing unit 132 (please note that the meaning of the synthesized signal is illustrated in the above embodiment), and the computation unit 236 performs calculation upon a quantization result of the synthesized signal to generate a selection signal S2 of this embodiment, for controlling the multiplexer 124.

It should be noted that the calculation performed by the computation unit 236 deals with a difference caused by the coupling means of the frequency divider 108 and the specific output terminal of the voltage-controlled oscillator 116, compared with that of the above-mentioned embodiment (i.e., the embodiment shown in FIG. 2). To achieve the same or similar result as the embodiment shown in FIG. 2, it is required to determine which oscillation signal of the K oscillation signals the multiplexer 124 should select as the output signal Fo, wherein the selection signal S2 corresponds to an input terminal in the input terminals of the multiplexer 124 to which a desired oscillation signal is inputted, in order to make the multiplexer 124 perform the above-mentioned selection (please note that the implementation of the above-mentioned computation unit 236 can be realized by a look-up table according to a theoretic computation or a trial-and-error experiment performed in advance, i.e. the look-up table is capable of decreasing the computation load. However, this is only an embodiment, and is not meant to limit the scope of the present invention). As a result, the phase-locked loop 200 is capable of compensating the initial period H2 for the phase shift corresponding to the time difference ΔT shown in FIG. 3. As is also shown in FIG. 3, the driving periods of various pixels at the second row pixel are all shifted by ΔT accordingly for adapting to the phase shift in the corresponding period of the horizontal synchronization signal HS1 to thereby drive the pixels at the second row correctly. Similarly, the driving periods of various pixels in the other row are also capable of being dynamically adjusted to adapt to the phase shift of a corresponding period of the horizontal synchronizing signal HS1.

Figure 5:
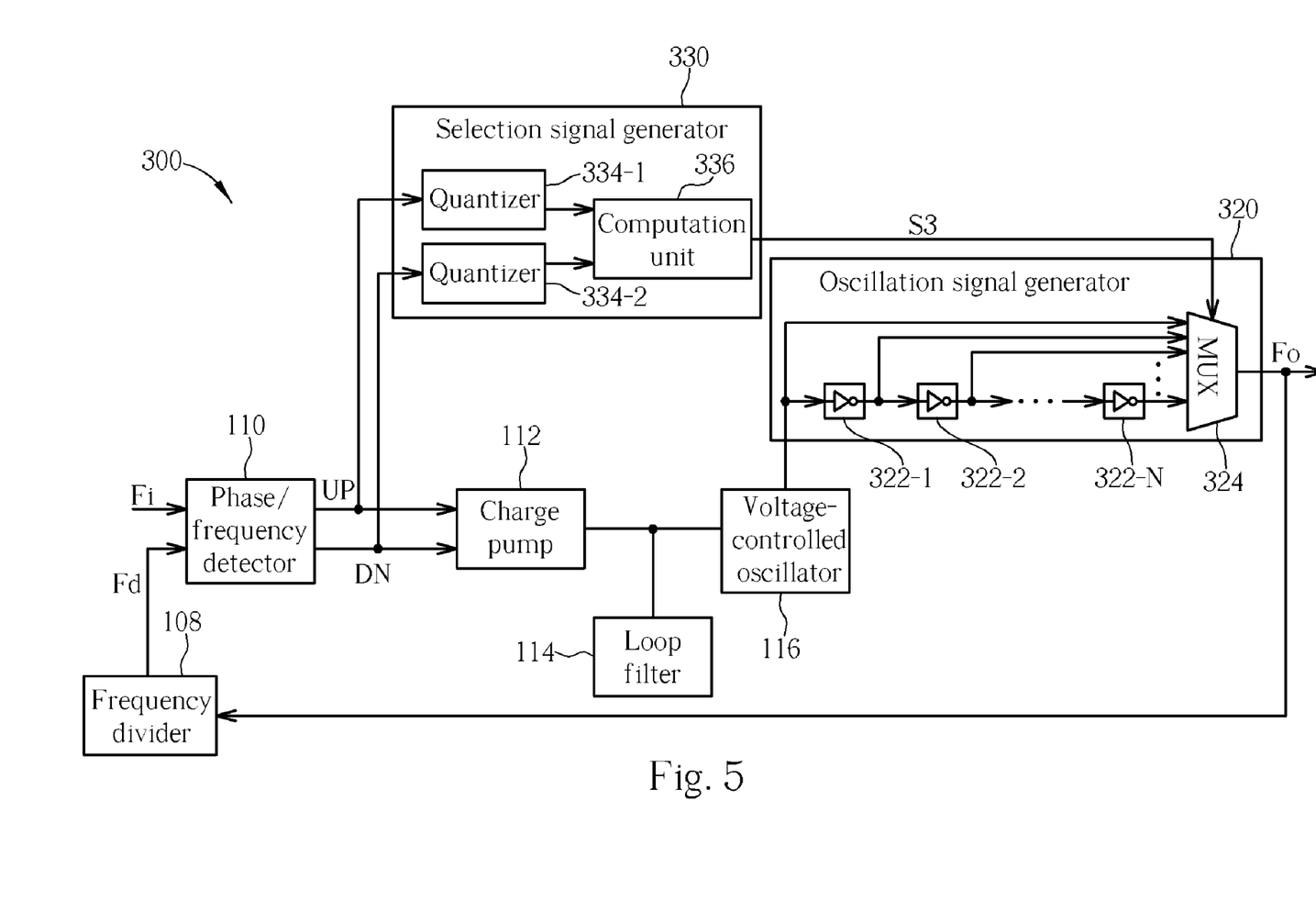
FIG. 5 is a diagram of a phase-locked loop according to a third embodiment of the present invention.

FIG. 5 is a diagram of a phase-locked loop 300 according to a third embodiment of the present invention. This embodiment is similar to the first embodiment, and a difference between these two embodiments is described as follows. In this embodiment, the aforementioned oscillation signal generator 120 is replaced with an oscillation signal generator 320, wherein the oscillation signal generator 320 comprises N delay units 322-1, 322-2, . . . , and 322-N and a multiplexer 324. The oscillation signal generator 320 is coupled to a specific output terminal of the voltage-controlled oscillator 116 (for example, the top-most output terminal in the J output terminals shown in FIG. 4. However, this is only an embodiment, and is not meant to limit the scope of the present invention). Therefore, the oscillation signal generator 320 only utilizes a first oscillation signal in the J first oscillation signals. The N delay units 322-1, 322-2, . . . , and 322-N delay the first oscillation signal to generate N oscillation signals of different phases, which are respectively outputted to the multiplexer 324. According to this embodiment, the oscillation signal generator 320 generates in total N+1 oscillation signals respectively outputted to the multiplexer 324, wherein the N+1 oscillation signals comprise the first oscillation signal and the N oscillation signals.

In addition, in this embodiment the aforementioned selection signal generator 130 is replaced with a selection signal generator 330, wherein the selection signal generator 330 comprises two quantizers 334-1 and 334-2 and a computation unit 336. The quantizers 334-1 and 334-2 respectively quantize the selection signals UP and DN to generate a first quantization signal and a second quantization signal, and the computation unit 336 calculates a sum or difference of the first quantization signal and the second quantization signal to generate a selection signal S3 of this embodiment, for controlling the multiplexer 324 to make the multiplexer 324 select an oscillation signal from the N+1 oscillation signals as the output signal Fo according to the selection signal S3. As a result, the phase-locked loop 300 compensates the initial period H2 for the phase shift corresponding to the time difference ΔT shown in FIG. 3. As is also shown in FIG. 3, the driving periods of various pixels in the second row are shifted by ΔT accordingly for adapting to the phase shift of a corresponding period of the horizontal synchronization signal HS1 to thereby drive the pixels at the second row correctly. Similarly, the driving periods of various pixels in other rows are also capable of being dynamically adjusted to adapt to the phase shift of a corresponding period of the horizontal synchronization signal HS1.

In an alternative design of this embodiment, the multiplexer of the oscillation signal generator selects an oscillation signal from the N oscillation signals as the output signal Fo according to the selection signal.

Figure 6:
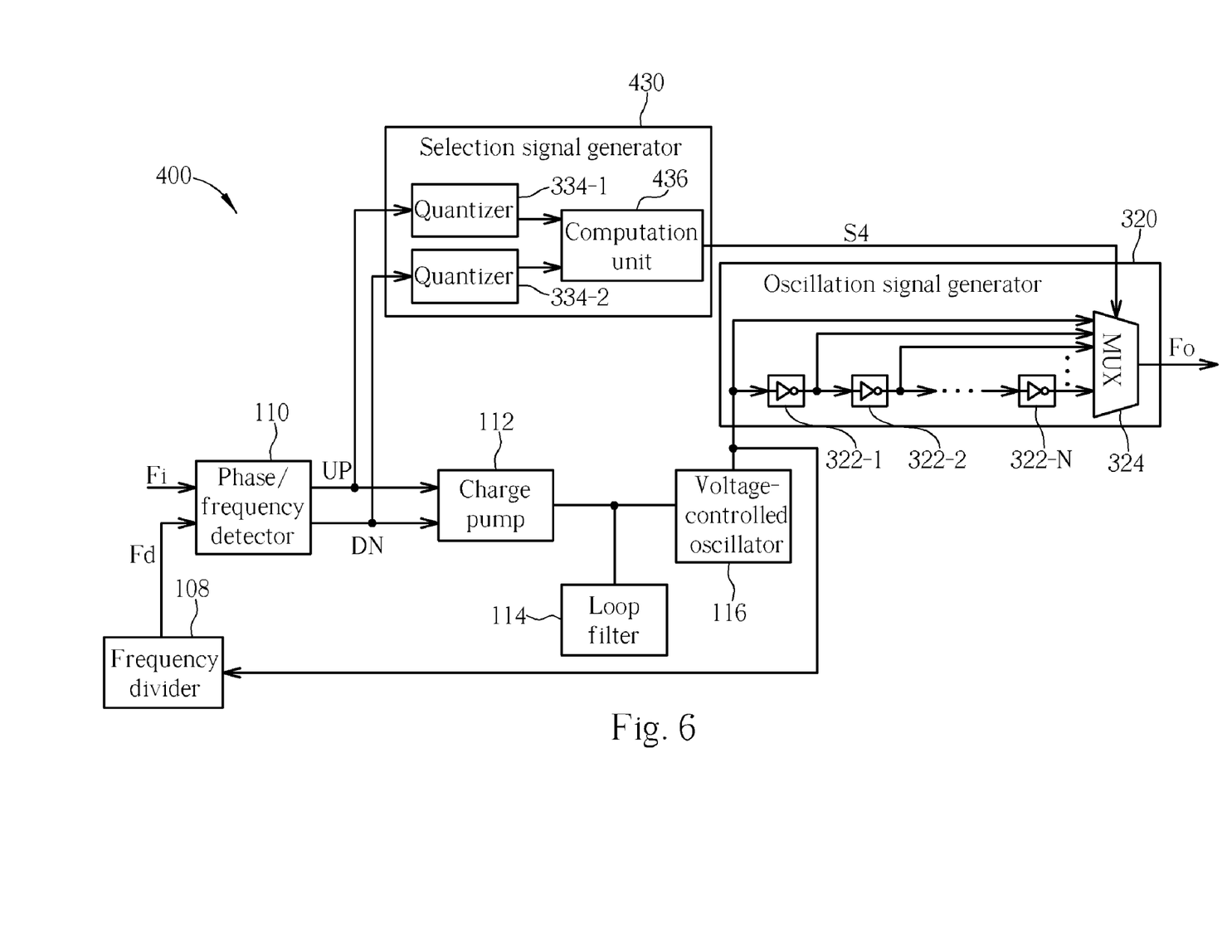
FIG. 6 is a diagram of a phase-locked loop according to a fourth embodiment of the present invention.

FIG. 6 is a diagram of a phase-locked loop 400 according to a fourth embodiment of the present invention. This embodiment is similar to the third embodiment, and a difference between these two embodiments is described as follows. In this embodiment, the frequency divider 108 is coupled to the specific output terminal of the voltage-controlled oscillator 116, so the phase-locked loop 400 utilizes the first oscillation signal outputted from the specific output terminal as the feedback signal instead of utilizing the output signal Fo as the feedback signal. In addition, in this embodiment the aforementioned selection signal generator 330 is replaced with a selection signal generator 430, wherein the aforementioned computation unit 336 is replaced with a computation unit 436. According to this embodiment, the computation unit 436 calculates a sum or difference of the first quantization signal and the second quantization signal to generate a selection S4 of this embodiment, for controlling the multiplexer 324 to make the multiplexer 324 select an oscillation signal from the N+1 oscillation signals according to the selection signal S4 as the output signal Fo. As a result, the phase-locked loop 400 is capable of compensating the initial period H2 for the phase shift corresponding to the time difference ΔT shown in FIG. 3. As is also shown in FIG. 3, the driving periods of various pixels in the second row pixel are shifted by ΔT accordingly for adapting to the phase shift in a corresponding period of the horizontal synchronization signal HS1 to thereby drive the pixels at the second row correctly. Similarly, the driving periods of various pixels in other rows are also capable of being dynamically adjusted to adapt to the phase shift in a corresponding period of the horizontal synchronization signal HS1.

In an alternative design of this embodiment, the frequency divider 108 is coupled to an output terminal of a specific delay unit in the N delay units 322-1, 322-2, . . . , and 322-N, so the phase-locked loop of the alternative design utilizes the oscillation signal generated by the output terminal of the specific delay unit as the feedback signal.

Those skilled in the art will readily observe that numerous modifications and alterations of the device and method may be made while retaining the teachings of the invention.

What is claimed is:

1. A phase-locking method comprising:
generating a selection signal according to a detection result of a phase/frequency detector of a phase-locked loop, wherein the detection result comprises a first detection signal and a second detection signal;
synthesizing the first detection signal and the second detection signal to generate a synthesized signal;
quantizing the synthesized signal;
performing a calculation upon the quantized synthesized signal to generate the selection signal;
generating a plurality of oscillation signals according to at least a first oscillation signal generated by the phase-locked loop, wherein the plurality of oscillation signals respectively correspond to a plurality of phases; and
from the plurality of oscillation signals, selecting an oscillation signal as an output signal of the phase-locked loop according to the selection signal.

2. The phase-locking method of claim 1, wherein the step of generating the plurality of oscillation signals further comprises:
performing a phase interpolation upon a plurality of first oscillation signals generated by the phase-locked loop to generate the plurality of oscillation signals.

3. The phase-locking method of claim 1, wherein the step of generating the plurality of oscillation signals further comprises:
delaying the first oscillation signal to generate the plurality of oscillation signals.

4. The phase-locking method of claim 1, wherein the phase/frequency detector generates the detection result according to an input signal and a feedback signal in the phase-locked loop.

5. The phase-locking method of claim 4, further comprising:
utilizing the input signal as the feedback signal.

6. The phase-locking method of claim 4, further comprising:

utilizing a specific oscillation signal out of the first oscillation signal and the plurality of oscillation signals as the feedback signal.

7. The phase-locking method of claim 4, further comprising:

utilizing the first oscillation signal as the feedback signal.

8. A phase-locked loop comprising:

a phase/frequency detector, for generating a detection result according to an input signal;

an oscillator, coupled to the phase/frequency detector, for generating at least a first oscillation signal according to the detection result;

an oscillation signal generator, coupled to the oscillator, for generating a plurality of oscillation signals according to the first oscillation signal, wherein the plurality of oscillation signals respectively correspond to a plurality of phases; and a selection signal generator, coupled to the phase/frequency detector and the oscillation signal generator, for generating a selection signal according to the detection result, wherein the detection result comprises a first detection signal and a second detection signal, and the selection signal generator comprises:

a synthesizing unit, for synthesizing the first detection signal and the second detection signal to generate a synthesized signal;

a quantizer, coupled to the synthesizing unit, for quantizing the synthesized signal; and a computation unit, coupled to the quantizer, for performing calculation upon the quantized synthesized signal to generate the selection signal;

wherein the oscillation signal generator selects an oscillation signal from the plurality of oscillation signals as an output signal of the phase-locked loop according to the selection signal.

9. The phase-locked loop of claim 8, wherein the first oscillation signal comprises a plurality of first oscillation signals, and the oscillation signal generator comprises:

a phase interpolator, for performing a phase interpolation upon the plurality of first oscillation signals to generate the plurality of oscillation signals; and a multiplexer, coupled to the phase interpolator, for selecting an oscillation signal from the plurality of oscillation signals as the output signal according to the selection signal.

10. The phase-locked loop of claim 8, wherein the oscillation signal generator comprises:

a plurality of delay units, for generating the plurality of oscillation signals through delaying the first oscillation signal;

a multiplexer, coupled to the plurality of delay units, for selecting an oscillation signal from the plurality of oscillation signals or the plurality of oscillation signals and the first oscillation signal as the output signal according to the selection signal.

11. The phase-locked loop of claim 8, wherein the phase/frequency detector generates the detection result according to the input signal and a feedback signal in the phase-locked loop, and the phase-locked loop utilizes the output signal as the feedback signal.

12. The phase-locked loop of claim 8, wherein the phase/frequency detector generates the detection result according to the input signal and a feedback signal in the phase-locked loop, and the phase-locked loop utilizes a specific oscillation signal from the first oscillation signal and the plurality of oscillation signals as the feedback signal.

13. The phase-locked loop of claim 12, wherein the specific oscillation signal is not the first oscillation signal.

14. The phase-locked loop of claim 8, wherein the phase/frequency detector generates the detection result according to the input signal and a feedback signal in the phase-locked loop, and the phase-locked loop utilizes the first oscillation signal as the feedback signal.

* * * * *